(12) United States Patent
Harvey

(10) Patent No.: US 7,253,510 B2
(45) Date of Patent: Aug. 7, 2007

(54) BALL GRID ARRAY PACKAGE CONSTRUCTION WITH RAISED SOLDER BALL PADS

(75) Inventor: Paul Marlan Harvey, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 10/346,277

(22) Filed: Jan. 16, 2003

(65) Prior Publication Data

US 2004/0141298 A1 Jul. 22, 2004

(51) Int. Cl.
| | |
|---|---|
| H01L 29/40 | (2006.01) |
| H01L 23/02 | (2006.01) |
| H01L 21/00 | (2006.01) |
| H01L 21/44 | (2006.01) |
| H05K 7/20 | (2006.01) |
| H05K 7/00 | (2006.01) |
| H05K 1/14 | (2006.01) |
| H05K 1/00 | (2006.01) |
| H05K 1/18 | (2006.01) |

(52) U.S. Cl. ............... 257/686; 257/737; 257/738; 257/777; 257/778; 257/780; 438/108; 438/109; 438/612; 361/720; 361/735; 361/736; 361/748; 361/760; 361/761

(58) Field of Classification Search ............... 257/686, 257/777, 778
See application file for complete search history.

(56) References Cited

U.S. PATENT DOCUMENTS

| | | | |
|---|---|---|---|
| 4,642,889 A | 2/1987 | Grabbe | |
| 5,097,393 A | 3/1992 | Nelson et al. | |
| 5,108,553 A | 4/1992 | Foster et al. | |
| 5,214,308 A | * 5/1993 | Nishiguchi et al. ......... 257/692 |
| 5,252,857 A | 10/1993 | Kane et al. | |
| 5,266,746 A | 11/1993 | Nishihara et al. | |
| 5,357,403 A | 10/1994 | Haller et al. | |
| 5,474,458 A | 12/1995 | Vafi et al. | |

(Continued)

FOREIGN PATENT DOCUMENTS

JP          6-204288      *  7/1994

(Continued)

OTHER PUBLICATIONS

Farber, A. S.; "High-Capacitance Power Distribution Network"; *IBM Technical Disclosure Bulletin*; Mar. 1967; vol. 9, No. 10; p. 1266.

(Continued)

*Primary Examiner*—Carl Whitehead, Jr.
*Assistant Examiner*—J. D. Mitchell
(74) *Attorney, Agent, or Firm*—Carr LLP; D'Ann N. Rifai

(57) ABSTRACT

The present invention provides for a BGA solder ball interconnection to an outer conductive layer of a laminated circuit assembly having an underlying circuit layer. The invention includes a raised BGA solder ball pad substantially co-planar with the outer conductive layer, the raised pad having a raised face and a plurality of vertical conductive walls and a BGA solder ball having an average diameter of greater than the width of the raised face, the BGA solder ball being adhered to the raised face and to a substantial portion of the vertical conductive walls.

15 Claims, 5 Drawing Sheets

U.S. PATENT DOCUMENTS

| | | | |
|---|---|---|---|
| 5,476,818 A | 12/1995 | Yanof et al. | |
| 5,578,796 A | 11/1996 | Bhatt et al. | |
| 5,639,696 A | 6/1997 | Liang et al. | |
| 5,642,261 A | 6/1997 | Bond et al. | |
| 5,689,091 A | 11/1997 | Hamzehdoost et al. | |
| 5,726,501 A * | 3/1998 | Matsubara | 257/778 |
| 5,736,679 A | 4/1998 | Kresge et al. | |
| 5,751,060 A * | 5/1998 | Laine et al. | 257/702 |
| 5,758,413 A | 6/1998 | Chong et al. | |
| 5,814,393 A | 9/1998 | Miyaake et al. | |
| 5,814,847 A | 9/1998 | Shihadeh et al. | |
| 5,829,124 A | 11/1998 | Kresge et al. | |
| 5,854,507 A | 12/1998 | Miremadi et al. | |
| 5,861,666 A | 1/1999 | Bellaar | |
| 5,891,753 A | 4/1999 | Akram | |
| 5,939,783 A * | 8/1999 | Laine et al. | 257/702 |
| 5,990,546 A | 11/1999 | Igarashi et al. | |
| 6,016,013 A * | 1/2000 | Baba | 257/778 |
| 6,020,561 A * | 2/2000 | Ishida et al. | 174/261 |
| 6,034,332 A | 3/2000 | Moresco et al. | |
| 6,050,832 A | 4/2000 | Lee et al. | |
| 6,084,300 A * | 7/2000 | Oka | 257/730 |
| 6,102,710 A | 8/2000 | Beilin et al. | |
| 6,104,082 A | 8/2000 | Berlin et al. | |
| 6,104,084 A | 8/2000 | Ishio et al. | |
| 6,121,676 A | 9/2000 | Solberg | |
| 6,121,682 A * | 9/2000 | Kim | 257/723 |
| 6,137,164 A | 10/2000 | Yew et al. | |
| 6,140,707 A | 10/2000 | Plepys et al. | |
| 6,153,508 A | 11/2000 | Harvey | |
| 6,175,158 B1 | 1/2001 | Degani et al. | |
| 6,175,161 B1 | 1/2001 | Goetz et al. | |
| 6,194,250 B1 | 2/2001 | Melton et al. | |
| 6,217,987 B1 * | 4/2001 | Ono et al. | 428/209 |
| 6,222,246 B1 * | 4/2001 | Mak et al. | 257/532 |
| 6,222,265 B1 | 4/2001 | Akram et al. | |
| 6,228,466 B1 * | 5/2001 | Tsukada et al. | 428/209 |
| 6,229,209 B1 * | 5/2001 | Nakamura et al. | 257/737 |
| 6,239,496 B1 * | 5/2001 | Asada | 257/777 |
| 6,291,267 B1 | 9/2001 | Dore et al. | |
| 6,297,551 B1 | 10/2001 | Dudderar et al. | |
| 6,300,161 B1 * | 10/2001 | Goetz et al. | 438/106 |
| 6,303,997 B1 * | 10/2001 | Lee | 257/778 |
| 6,310,403 B1 * | 10/2001 | Zhang et al. | 257/786 |
| 6,331,939 B1 | 12/2001 | Corisis et al. | |
| 6,333,563 B1 | 12/2001 | Jackson et al. | |
| 6,335,571 B1 * | 1/2002 | Capote et al. | 257/787 |
| 6,388,333 B1 * | 5/2002 | Taniguchi et al. | 257/777 |
| 6,396,707 B1 * | 5/2002 | Huang et al. | 361/760 |
| 6,443,351 B1 * | 9/2002 | Huang et al. | 228/103 |
| 6,492,255 B2 | 12/2002 | Enomoto et al. | |
| 6,492,600 B1 * | 12/2002 | Jimarez et al. | 174/262 |
| 6,559,390 B1 * | 5/2003 | Tanaka | 174/260 |
| 6,580,169 B2 * | 6/2003 | Sakuyama et al. | 257/738 |
| 6,756,684 B2 * | 6/2004 | Huang | 257/778 |
| 6,756,685 B2 | 6/2004 | Tao | |
| 6,803,663 B2 * | 10/2004 | Hashimoto | 257/777 |
| 6,828,669 B2 * | 12/2004 | Iijima et al. | 257/700 |
| 6,984,544 B2 * | 1/2006 | Cloud et al. | 438/107 |
| 7,019,407 B2 * | 3/2006 | Chen et al. | 257/778 |
| 2002/0014346 A1 * | 2/2002 | Tsunemasu et al. | 174/52.1 |
| 2002/0053466 A1 * | 5/2002 | Kasui | 174/260 |
| 2002/0068381 A1 | 6/2002 | Ference et al. | 438/108 |
| 2003/0006494 A1 * | 1/2003 | Lee et al. | 257/686 |
| 2003/0047348 A1 * | 3/2003 | Jessep et al. | 174/250 |
| 2003/0164551 A1 * | 9/2003 | Lee et al. | 257/778 |
| 2003/0215249 A1 * | 11/2003 | Shinkawa et al. | 399/38 |
| 2003/0234118 A1 * | 12/2003 | Hsu et al. | 174/262 |
| 2004/0129453 A1 * | 7/2004 | Boggs et al. | 174/261 |

FOREIGN PATENT DOCUMENTS

| | | |
|---|---|---|
| JP | 2001-156121 | 6/2001 |
| JP | 2001156121 | 6/2001 |

OTHER PUBLICATIONS

Cavaliere, J. R. et al.; "High-Performance Single-Chip Module"; *IBM Technical Disclosure Bulletin*; Jun. 1981; vol. 24, No. 1A; pp. 46-48.

* cited by examiner

BALL GRID ARRAY PACKAGE CONSTRUCTION WITH RAISED SOLDER BALL PADS

CROSS-REFERENCED APPLICATIONS

This application relates to co-pending U.S. patent applications entitled "Method and Apparatus for Interconnecting a Relatively Fine Pitch Circuit Layer and Adjacent Power Plane(s) in a Laminated Construction" Ser. No. 10/346,285 and "Flex-Based IC Package Construction Employing a Balanced Lamination" Ser. No. 10/346,286, filed concurrently herewith, the contents of which are hereby incorporated by reference.

BACKGROUND OF THE INVENTION

1. Field of the Invention

This invention relates generally to the field of integrated circuit packaging.

2. Description of the Related Art

In the manufacture of integrated circuits, extremely fine circuits are photolithographically placed onto a chip, also called a die. The circuits on the chip terminate at conductive terminals on the face of the chip, which must be electrically connected to power and to other chips. For protection of the chip and ease of handling, the chips are bonded to a substrate and placed in a package having electrical connections ultimately leading to a conventional printed circuit board. One attractive means of connecting the conductive terminals on a chip is the technique where the terminals on the face of the chip are distributed over the face of the chip in a pattern of "C4" connections. These terminals are typically connected to a circuit substrate by conductive paste or solder.

In some integrated circuit packaging, the chip is mounted to the underside of a circuit substrate with its C4 connections facing the circuit substrate. Also, in some integrated circuit packaging applications, there are at least two integrated circuit chips having very high communication bandwidth or bitrate between them. For example, a high speed processor often requires a very high communication bandwidth with an associated memory chip. A cost-effective, high bandwidth interconnection between two (or more) devices can be made by stacking chips with the C4 patterns facing each other and electrically interconnecting them vertically using very short connections between the chips. This approach ensures a consistent, very short length interconnect between the chips which can enable extremely wide, high speed, low skew busses between the two chips.

Where two chips are stacked facing each other, an interposer, for example, an intermediate circuit layer, between the devices is usually necessary to efficiently distribute power to the devices and facilitate high yield assembly and test. Ideally, the interposer should be no thicker than required to adequately distribute power to the devices since the thickness of the interposer increases the interconnect length of the busses between the devices and effectively degrades the electrical performance of the interconnect. An advantageous interposer is fabricated as a lamination having a two metal layer (2ML) bumped circuit layer with overlaying outer conductive layers bonded to the 2ML circuit layer with an intervening layer of insulating adhesive.

Attachment of the chip on the underside of the interposer can pose a clearance difficulty. A typical BGA solder ball array may use solder balls in the range of 400 to 800 microns in diameter, more typically 400 to 600 microns. For example, the C4 connections of the chip on the lower side of the interposer may be attached with solder balls or paste that may have a thickness of approximately 100 microns and the chip itself may have a thickness in the range of approximately 350 microns. If it is desired to have an approximately 200 micron clearance between the chip and the bottom substrate of the package, it would be difficult or impossible to achieve the necessary clearance using a typical BGA solder ball array having solder balls in the range of 400 to 600 microns in diameter connected to the bottom of a circuit substrate, without thinning the inactive face of the chip.

To alleviate this clearance problem, taller, multi-component solder columns in large ceramic BGA (CBGA) package applications could be used. Taller columns are required in some applications to ensure the board level reliability due to the large mismatch between thermal expansion of the CBGA and the board on which it is mounted, which creates stress between the solder column and the connection pad at the point of connection. The stress on the interconnect is reduced as the height of these solder columns is increased. Although solder columns could be used to provide the necessary clearance for a chip mounted on the underside of the package as described above, this would add cost to the package and additionally may not be compatible with desired board-level assembly processes.

SUMMARY OF THE INVENTION

Therefore, in accordance with an embodiment of the present invention, a BGA solder ball interconnection to an outer conductive layer of a laminated circuit assembly is provided having an underlying circuit layer, comprising a raised BGA solder ball pad substantially coplanar with the outer conductive layer, the raised pad having a raised face and vertical conductive walls greater than about 75 microns and a BGA solder ball adhered to the raised face.

In accordance with another aspect of this embodiment, the BGA solder ball has an average diameter of greater than the width of the raised face.

In accordance with another aspect of this embodiment, the BGA solder ball has an average diameter of greater than approximately two times the width of the raised face.

In accordance with another aspect of this embodiment, the BGA solder ball is further adhered to a substantial portion of at least one of the vertical walls.

In accordance with another aspect of this embodiment, the raised pad is formed by photolithographic etching away of portions of the outer conductive layer.

In accordance with another aspect of this embodiment, the raised pad is contiguous with a portion of the outer conductive layer serving as a power plane for a chip.

In accordance with another aspect of this embodiment, the raised pad has a longitudinally extending offset portion.

In accordance with another aspect of this embodiment, the raised pad is not contiguous with a portion of the outer conductive layer serving as a power plane for a chip.

In accordance with another aspect of this embodiment, the raised pad has an enlarged base portion and the offset portion extends longitudinally from the enlarged base portion.

In accordance with another aspect of this embodiment, the base portion has a window defined therein, the window including solder or electrically conductive paste electrically connecting the raised pad to the underlying circuit layer.

In accordance with another aspect of this embodiment, the underlying circuit layer includes an upstanding bump, the window having a width substantially greater than the width of the bump and the solder or conductive paste is electrically connected to the bump.

In accordance with another aspect of this embodiment, further comprising a solder mask layer over the underlying conductive layer, the solder mask layer has a window defined therein exposing at least a portion of the raised face of the raised pad, the solder ball being adhered to the raised face.

In accordance with another aspect of this embodiment, at least a portion of the vertical conductive walls of the raised pad is exposed and the solder ball is further adhered to a substantial portion of at least one of the vertical conductive walls.

In accordance with another embodiment of the present invention, an integrated circuit package construction for an underhung flip chip is provided comprising a laminated circuit assembly having an underlying circuit layer, an insulating layer and an outer conductive layer, an integrated circuit chip disposed in a window in the outer conductive layer and a plurality of solder balls of a first diameter connecting the chip to an underside of the inner circuit layer. There is at least one region of the overlying conductive trace layer defined as a raised conductive pad, the region having a plurality of vertical conductive walls spaced apart from conductive material not intended to be connected. A BGA solder ball having a second diameter greater on the average than the first diameter is provided, one side of the BGA solder ball being adhered to the raised face and another side of the BGA solder ball being adhered to a conductive portion of a bottom substrate, the height of the vertical conductive walls combined with the diameter of the BGA solder ball being sufficient to define a clearance between the integrated circuit chip and the bottom substrate.

In accordance with another aspect of this embodiment, the average diameter of the BGA solder ball is greater than the width of the raised face.

In accordance with another aspect of this embodiment, the BGA solder ball is further adhered to a substantial portion of at least one of the vertical walls.

In accordance with another aspect of this embodiment, the vertical walls are at least 25 microns high.

In accordance with another aspect of this embodiment, the vertical walls are at least about 75 microns high.

In accordance with another aspect of this embodiment, the BGA solder ball has an average diameter of greater than approximately two times the width of the raised face.

In accordance with another aspect of this embodiment, the raised pad is formed by photolithographic etching away of portions of the outer conductive layer.

In accordance with another aspect of this embodiment, the raised pad is contiguous with a portion of the outer conductive layer serving as a power plane for a chip.

In accordance with another aspect of this embodiment, the raised pad has a longitudinally extending offset portion.

In accordance with another aspect of this embodiment, the raised pad is not contiguous with a portion of the outer conductive layer serving as a power plane for a chip.

In accordance with another aspect of this embodiment, the raised pad has a longitudinally extending offset portion.

In accordance with another aspect of this embodiment, the raised pad has an enlarged base portion and the offset portion extends longitudinally from the enlarged base portion.

In accordance with another aspect of this embodiment, the base portion has a window defined therein, the window including solder or electrically conductive paste electrically connected to an underlying circuit layer.

In accordance with another aspect of this embodiment, the underlying circuit layer includes an upstanding bump, the window having a width substantially greater than the width of the bump and the solder or conductive paste is electrically connected to the bump.

In accordance with another aspect of this embodiment, comprising a solder mask layer over the underlying conductive layer, the solder mask layer has a window defined therein exposing at least a portion of the raised face of the raised pad, the solder ball being adhered to the raised face.

In accordance with another aspect of this embodiment, the solder ball is further adhered to a substantial portion of at least one of the vertical conductive walls.

In accordance with another embodiment of the present invention, a method of making a BGA solder ball interconnection to an outer conductive layer of a laminated circuit assembly is provided comprising the steps of laminating an outer conductive layer having a thickness of at least about 75 microns over an insulating layer covering an underlying circuit layer, selectively removing portions of the outer conductive layer around a region of the outer conductive layer to define a raised pad having a plurality of vertical conductive walls at least about 75 microns high, the vertical walls being spaced apart from conductive material not intended to be connected, and adhering a BGA solder ball having an average diameter greater than the width of the raised face to the raised face.

In accordance with another aspect of this embodiment, the BGA solder ball is further adhered to a substantial portion of at least one of the vertical conductive walls.

In accordance with another aspect of this embodiment, the BGA solder ball has an average diameter of greater than approximately two times the width of the raised face.

In accordance with another aspect of this embodiment, the raised pad is formed by photolithographic etching away of portions of the outer conductive layer over the insulating layer.

In accordance with another aspect of this embodiment, the raised pad is contiguous with a portion of the outer conductive layer serving as a power plane for a chip.

In accordance with another aspect of this embodiment, the raised pad is formed having a longitudinally extending offset portion.

In accordance with another aspect of this embodiment, the raised pad is formed non-contiguously with a portion of an outer conductive layer serving as a power plane for a chip.

In accordance with another aspect of this embodiment, the raised pad is formed having a longitudinally extending offset portion.

In accordance with another aspect of this embodiment, the raised pad is formed having an enlarged base portion and the offset portion extends longitudinally from the enlarged base portion.

In accordance with another aspect of this embodiment, the method of making a BGA solder ball interconnection further comprises selectively removing portions of the outer conductive layer from the base to form a window therein and depositing solder or electrically conductive paste to electrically connect the base to the underlying circuit layer.

In accordance with another aspect of this embodiment, wherein the underlying circuit layer includes an upstanding bump, the window has a width substantially greater than the width of the bump and the solder or conductive paste is electrically connected to the bump.

In accordance with another aspect of this embodiment, the BGA solder ball interconnection further comprises a solder mask layer over the overlying conductive layer, the solder mask layer having a window defined therein exposing at least a portion of the raised face of the raised pad and at least a portion of the vertical conductive walls of the raised pad, the solder ball being adhered to the raised face.

In accordance with another aspect of this embodiment, the BGA solder ball is further adhered to a substantial portion of at least one of the vertical conductive walls.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

The foregoing and other objects, features and advantages of the invention will be apparent from the following more particular description of a preferred embodiment of the invention, as illustrated in the accompanying drawings, wherein like reference numbers represent like parts.

Figure 5:
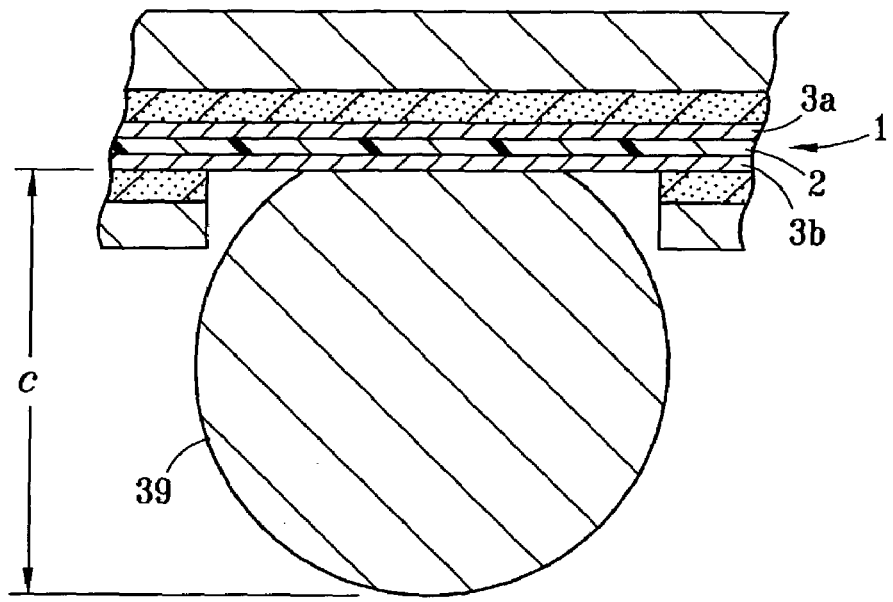
FIG. 5 is a cross-sectional view of a prior art interconnection between a BGA solder ball and its connection pad on the circuit substrate.
Figure 6:
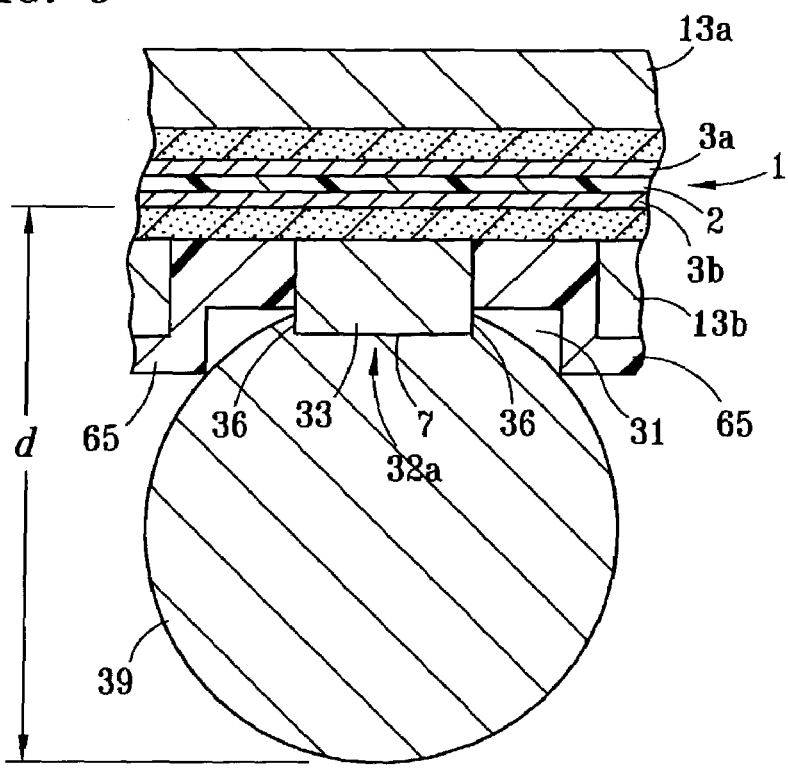
FIG. 6 is a cross-sectional view, taken through FIG. 4, showing a cross-section of an end view of a preferred peninsula form of the raised BGA solder ball pad.

Referring now to the drawings in detail, and initially to FIG. 5 thereof, a crosssectional view of a typical prior art interconnection between a BGA solder ball 39 and its connection pad 55 on a trace 56 of a circuit substrate 57 is depicted. Taking into account that the solder ball is flattened somewhat where it connects to the substrate, if a 600 micron solder ball is used, the distance "a" between the lower face of the circuit layer (not counting the solder mask layer) and the bottom of the solder ball will be about 500 microns from the connection pad 55.

Figure 1:
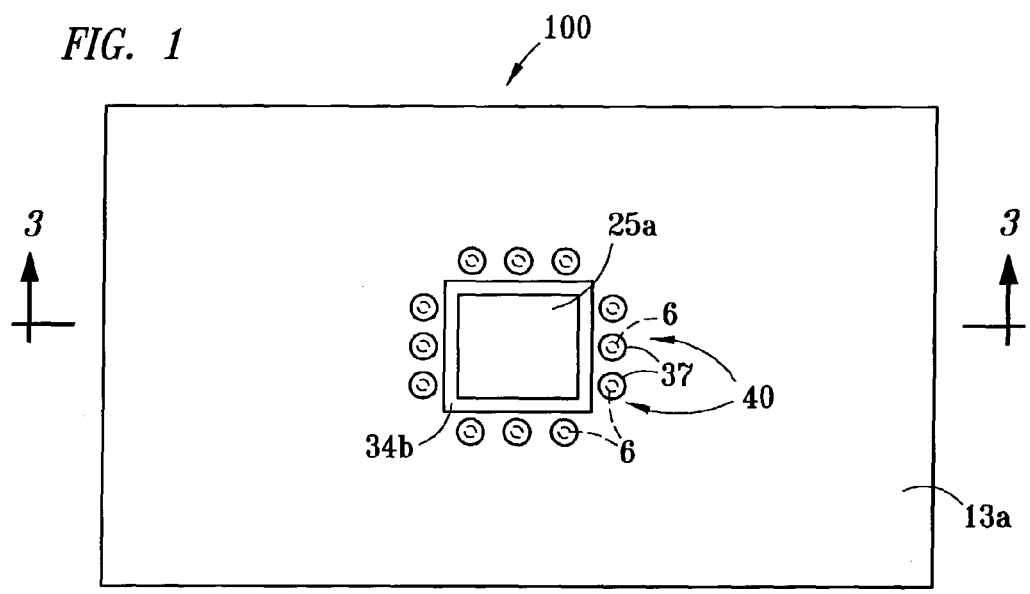
FIG. 1 is a plan view from the top of an integrated circuit package employing raised BGA ball interconnections in accordance with a preferred embodiment of the present invention.
Figure 2:
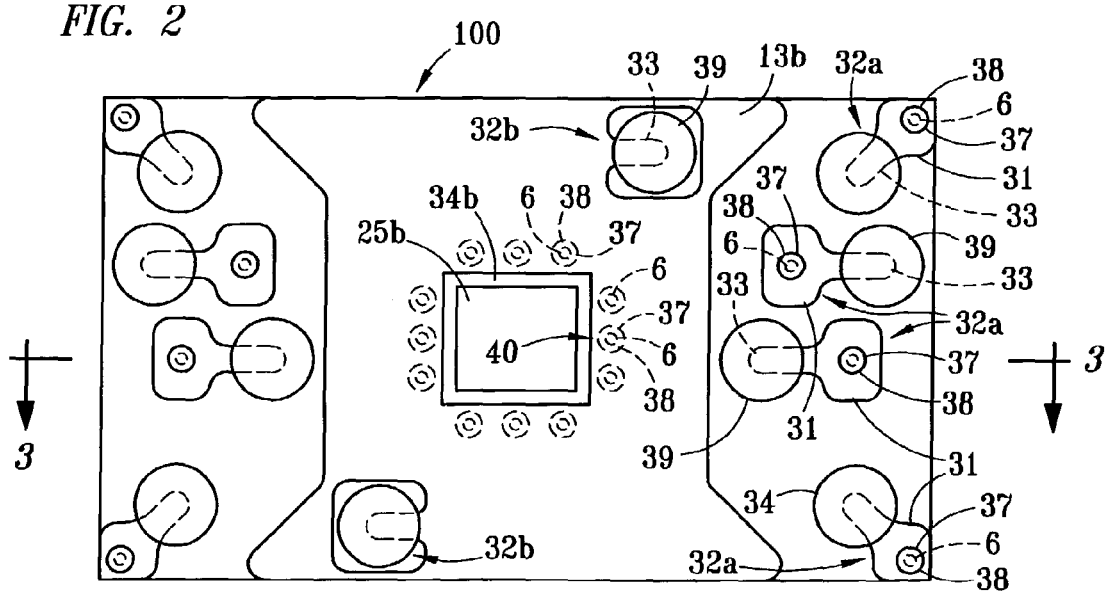
FIG. 2 is a plan view from the bottom of an integrated circuit package employing raised BGA ball interconnections in accordance with a preferred embodiment of the present invention.
Figure 3A:
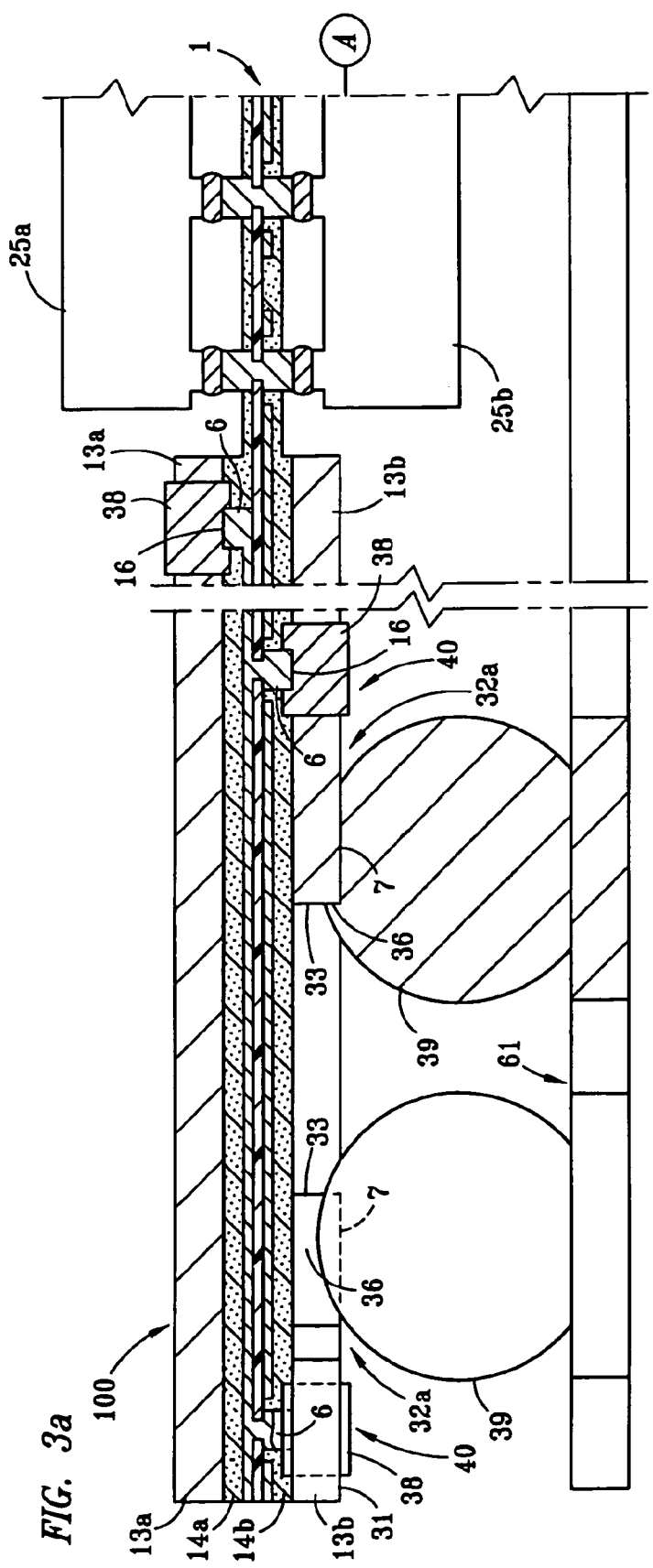
FIG. 3a is an enlarged view of a portion of the integrated circuit package depicted in FIGS. 1 and 2, depicting the position of the BGA balls on the raised pad and bottom substrate.
Figure 3B:
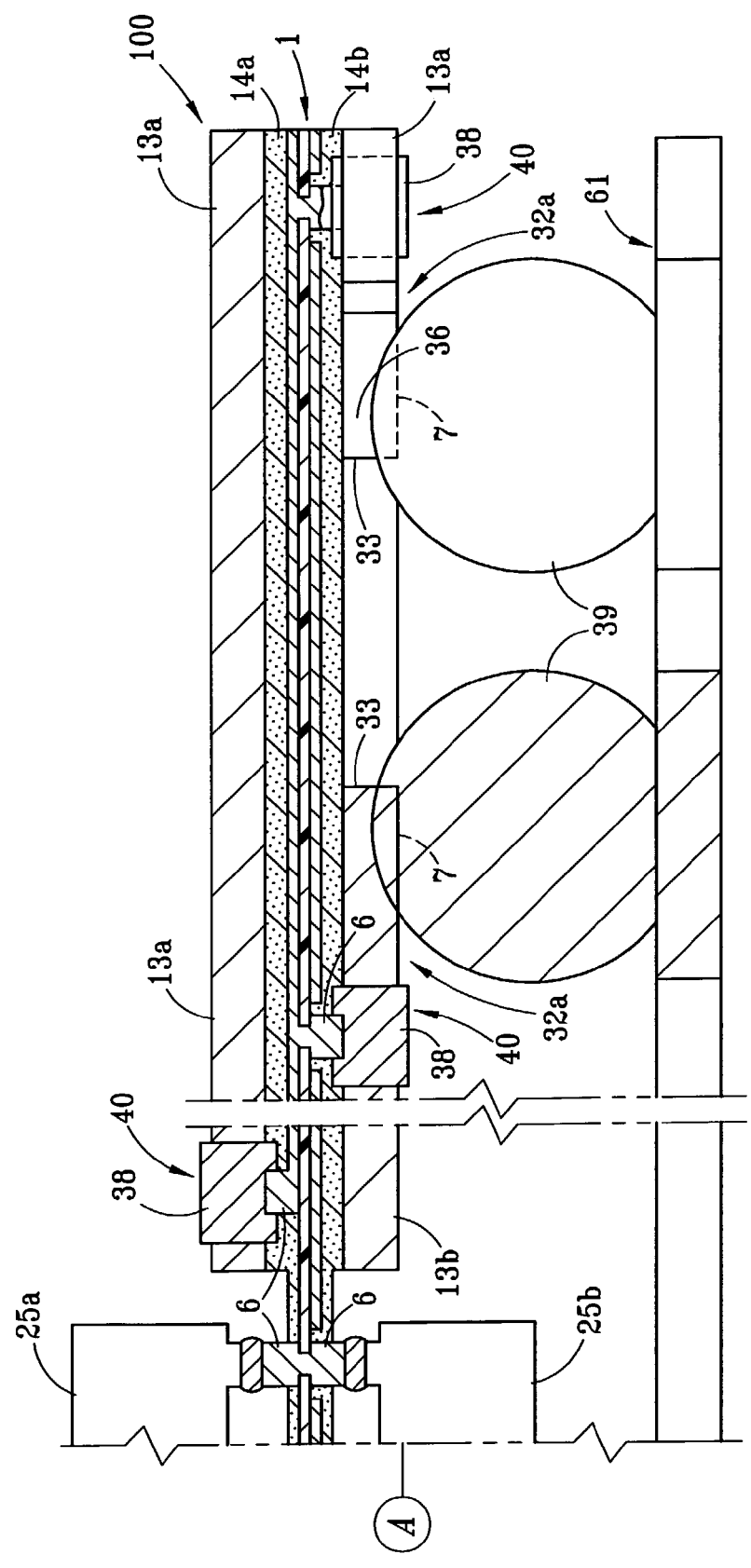
FIG. 3b is an enlarged view of the portion of the integrated circuit package depicted in FIGS. 1 and 2, on the other side of the integrated circuit, depicting the position of the BGA balls on the raised pad and bottom substrate.

Referring now to FIG. 2, a raised pad 32a for a BGA solder ball 39 in accordance with the present invention is depicted. The raised solder ball pad 32a is preferably fabricated from an outer conductive layer of a laminated circuit structure by selectively removing portions of the outer conductive layer 3b, as described in the referenced patent applications. As described in the referenced patent applications in more detail, a laminate circuit assembly 100 preferably has an underlying bumped two metal layer (2ML) circuit assembly 1 having a medial insulating layer 2 and bumped circuit layers 3a and 3b having a plurality of C4 bumps 6. On the outside of the assembly are preferably two outer conductive layers 13a and 13b. In one embodiment, each of outer conductive layers 13a and 13b has a thickness between about 25 to 300 microns. In another embodiment, each of outer conductive layers 13a and 13b has a thickness between about 50 and 150 microns. In another embodiment, each of outer conductive layers 13a and 13b has a thickness of between about 75 to 125 microns. Each of layers 13a and 13b are bonded to each side of the bumped circuit layer 1 with a layer 14a and 14b in a suitable manner, preferably by means of insulating adhesive in between them. The preferred material for the outer conductive layers 13a and 13b is copper but other conductive materials having reasonable heat conductivity may be used.

To fabricate a preferred embodiment of the raised BGA solder ball pad 32a, the lower outer conductive layer 13b is photolithographically defined so that the regions surrounding the desired pad locations can be etched away to the insulating adhesive layer 14b, the remaining portions of the lower outer conductive layer 13b forming the raised pad 32a. Since the raised pads 32a is preferably formed from the outer conductive layer 13b, its height, i.e., thickness, is preferably substantially the same as the original thickness of the outer conductive layer 13b. However, both the original thickness of the conductive layer and the final thickness of the pad can be varied as required.

Each raised pad 32a is electrically connected to the interconnection 40 to the desired bump 6 on the inner circuit layer. Advantageously, this interconnection 40 is of the type described in the referenced patent applications, although this is not required. As depicted in FIGS. 2-4 and 6, one advantageous means of accomplishing interconnection 40 is to configure the pad as a peninsula 33 of conductive material extending from a base portion 31. The base portion 31 preferably includes an opening 37 defined therein including conductive paste or solder 38 to form the interconnection 40 between the C4 bump 6 on the lower bumped circuit layer 3b of the 2ML circuit layer assembly 1. This produces a solder ball pad 32a horizontally offset from the location of the base portion 31, having a top 7 vertically located at an elevation that is significantly different than the C4 mounting surface of the lower bumped circuit layer 3b. As can be seen, the solder ball pads 32a can be separate from each other and from the major power plane portion of the outer conductive layer 13b. Alternatively, a raised pad 32b can have a peninsula portion 33 extending contiguously from the major planar portion of outer conductive layer 13b. The raised solder ball pads 32a have a somewhat smaller width than the footprint of the BGA solder ball 39 at the point of connection to the pad. This allows the solder ball to re-flow to the vertical sides 36, as well as the top 7, of the pad 32a, increasing the strength of the interconnection and the reliability of the package-board solder ball connections. For the peninsula configuration described above, of course, the vertical sides 36 are present around the sides and end of the peninsula 33. For a 600 micron solder ball, a width of the peninsula 33 in the range of approximately 100 to 400 microns at the site of the solder ball is advantageous.

Of course, the invention also contemplates other configurations, such as an isthmus configuration connecting two base portions.

Turning now to FIGS. 1-4 and 6, an embodiment of the raised BGA solder ball pad interconnection of the present invention is depicted in use with a packaged integrated circuit chip 25b. In this exemplary embodiment, the BGA solder ball 39 has a diameter of about 600 microns, and the distance between the circuit layer upon which the integrated circuit chip and the bottom substrate upon which the other side of the BGA solder ball is mounted is about 600 microns. By contrast, using a 600 micron diameter BGA solder ball and a pad configuration in accordance with the prior art, as depicted in FIG. 5, the distance c between the pad on the bottom substrate upon which the other side of the 600 micron diameter solder ball is mounted would be about 500 microns. The elevation difference owing to use of the present invention allows a chip to be mounted to the underside of the package substrate, while leaving a clearance between the chip and the bottom substrate, with minimal chip thinning required. This facilitates vertical interconnection between two or more chips without cutting an opening in the board that the package is mounted on. This is particularly advantageous where the raised BGA solder ball pad interconnection of the present invention is used in conjunction with a laminated circuit structure having overlying outer conductive layers 13a and 13b laminated over a two metal layer (2ML) circuit layer 1, as in the referenced patent applications.

Figure 4:
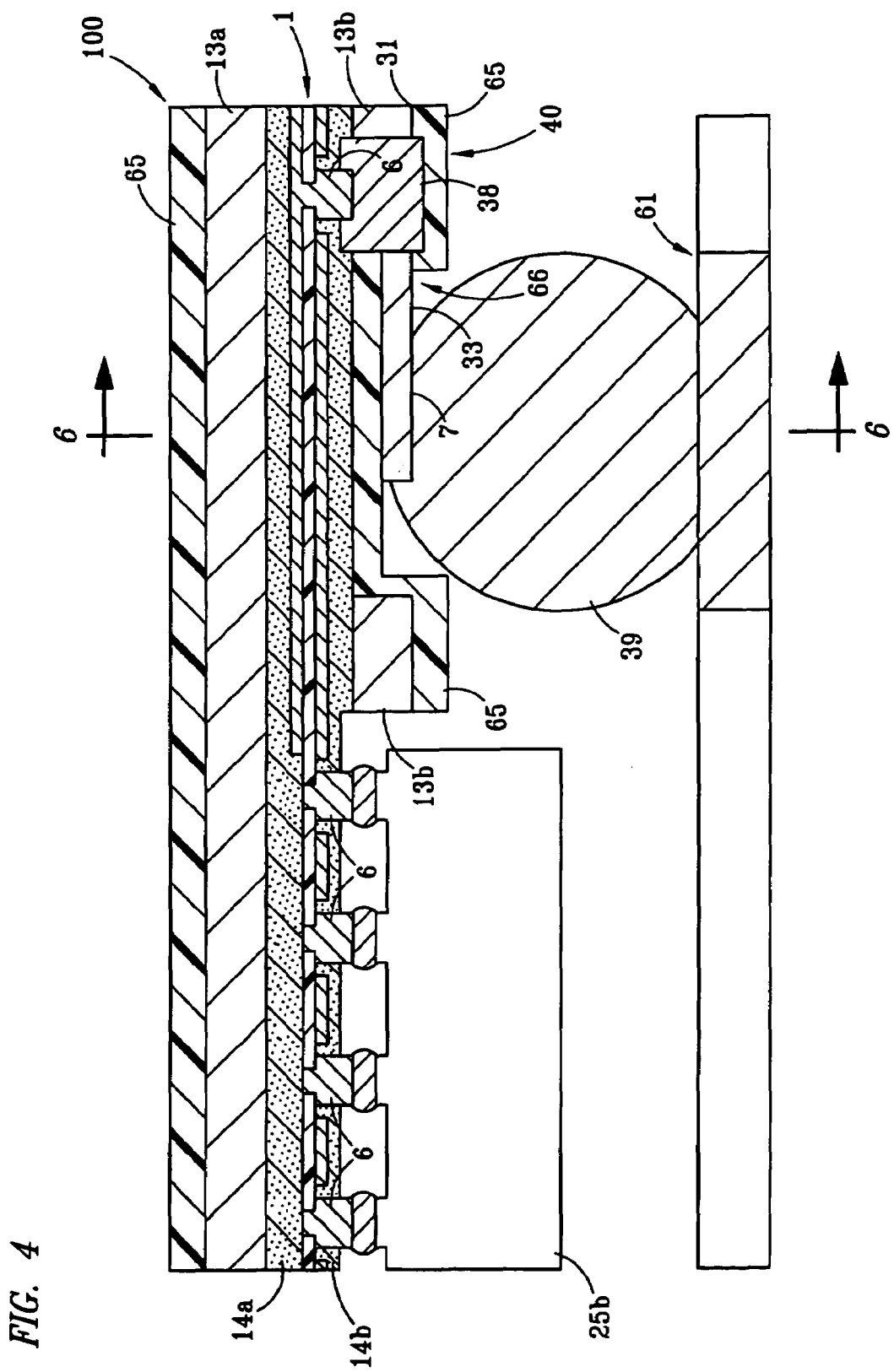
FIG. 4 is an enlarged cross-sectional view of a portion of the integrated circuit package having a single underhung mounted chip, depicting the position of one of the BGA balls on the raised pad and bottom substrate.

As can also be seen in FIG. 4, the raised pads 32a and 32b proposed in the present invention also enable single chip packages with flip chip attachment. Since the flip chip interface is very thermally efficient, a majority of the heat from the device can be dissipated through the bumped C4 interconnects 40 and through the thin package substrate to the copper outer conductive layers 13a and 13b. The heat can then be dissipated through the bottom substrate 61 and/or very efficiently through a heat sink (not shown) attached directly to the entire upper surface of the package substrate, over the upper outer conductive layer 13a. The increased area of attachment of the heat sink significantly improves the thermal performance of the heat sink in the application. Attachment of the chip 25b to the underside of a bumped circuit layer 1 also allows the chip to thermally contact with the bottom substrate by employing a thermally conductive interface potting material 61 between the non-active face of the chip 25b and the opposing bottom substrate 61. This enables an additional heat conduction path, reducing cooling difficulties for the chip.

If it is desired to increase the effective clearance, a solder mask layer 65 can be placed over the conductive layer 13b prior to attachment of solder or conductive paste. In this configuration, depicted in FIGS. 4 and 6, a solder mask layer 65 has been added over conductive layer 13b after fabrication of raised pad 32a. Next, the areas of solder mask layer 65 above the attachment ends 33 of raised pad 32a have been selectively etched away, preferably using either chemical etching or plasma etching, to make a window 66 exposing at least a portion of the top 7 of the end 33 of raised pad 32a, and as much or as little of sides 36 as desired. In this way, when solder is adhered to the end 33 of raised pad 32a, the window 66 of solder mask 65 will define the shape of the solder ball 39 and hold it up higher on the end 33 of raised pad 32a to the degree desired, and will adhere to the exposed parts of vertical walls 36. By controlling the size of window 66, the solder ball 39 can be held away from layer 3b a distance d, enhancing clearance between integrated circuit 25b and substrate 61.

The performance and design advantages can be realized with little or no additional cost to the package, because the raised pads 32a and/or 32b can be fabricated using the same manufacturing process steps outlined in the referenced patent applications, at the same time. That is, the raised pads 32a and 32b can be fabricated by photolithographic etching of the lower outer conductive layer 13b at the same time as interconnection openings 37 and chip windows 34a and 34b.

Of course, to protect the areas of the insulating adhesive layers 14a and 14b that are not desired to be etched away during plasma etching of the adhesive to expose the tops 16 of the bumps 6 (for example, the areas between the raised pads 32a or 32b), an additional photoresist and imaging step would preferably be used. However, the precision of the registration required for this step is relatively modest. Thus, this additional step should not significantly reduce the yield.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

The invention claimed is:

1. An integrated circuit package construction for an underhung flip chip, comprising:
 a laminated circuit assembly having an underlying circuit layer having a connection side adapted for face to face operative connection of an underhung integrated circuit chip, the laminated circuit assembly further having an insulating layer and a downwardly facing outer conductive layer over the insulating layer and below the connection side, an underhung integrated circuit chip disposed in a window in the outer conductive layer and a plurality of solder balls of a first diameter connecting the chip to the connection side of the underlying circuit layer, said underhung integrated circuit chip have a lower side facing a separate bottom substrate;
 at least one region of the overlying conductive layer defined as a raised conductive pad, the pad being raised above said connection surface a substantial height and having a plurality of vertical conductive walls spaced apart from conductive material not intended to be connected;
 a BGA solder ball having a second diameter greater on the average than the first diameter, one side of the BGA solder ball being adhered to the raised face and another side of the BGA solder ball being adhered to a conductive portion of the bottom substrate, the diameter of the BGA solder ball alone being such that it is insufficient alone to define a clearance between the lower side of the underhung integrated circuit chip and the bottom substrate absent the height of the raised pad, the height of the raised pad combined with the diameter of the BGA solder ball as disposed on the raised pad being sufficient to define a clearance between the lower side of the underhung integrated circuit chip and the bottom substrate.

2. The integrated circuit package construction defined in claim 1, wherein the BGA solder ball is further adhered to a substantial portion of at least one of the vertical walls.

3. The integrated circuit package construction defined in claim 1, wherein the vertical walls are at least 25 microns high.

4. The integrated circuit package construction defined in claim 1, wherein the vertical walls are at least about 75 microns high.

5. The integrated circuit package construction defined in claim 1, wherein the BGA solder ball has an average diameter of greater than approximately two times the width of the raised face.

6. The integrated circuit package construction defined in claim 1, wherein the raised pad is formed by photolithographic etching away of portions of the outer conductive layer.

7. The integrated circuit package construction in claim 1, wherein the raised pad is contiguous with a portion of the outer conductive layer serving as a power plane for a chip.

8. The integrated circuit package construction defined in claim 1, wherein the raised pad has a longitudinally extending offset portion.

9. The integrated circuit package construction defined in claim 1, wherein the raised pad is not contiguous with a portion of the outer conductive layer serving as a power plane for a chip.

10. The integrated circuit package construction defined in claim 1, wherein the raised pad has a longitudinally extending offset portion.

11. The integrated circuit package construction defined in claim 10, wherein the raised pad has an enlarged base portion and the offset portion extends longitudinally from the enlarged base portion.

12. The integrated circuit package construction defined in claim 11, wherein the base portion has a window defined therein, the window including solder or electrically conductive paste electrically connected to an underlying circuit layer.

13. The integrated circuit package construction defined in claim 1, wherein the underlying circuit layer includes an upstanding bump, the window having a width substantially greater than the width of the bump and the solder or conductive paste is electrically connected to the bump.

14. The integrated circuit package construction defined in claim 1, further comprising a solder mask layer over the underlying conductive layer, the solder mask layer having a window defined therein exposing at least a portion of the raised face of the raised pad, the solder ball being adhered to the raised face.

15. The BGA solder ball interconnection defined in claim 1, wherein the solder ball is further adhered to a substantial portion of at least one of the vertical conductive walls.

* * * * *